(12) United States Patent
Seko et al.

(10) Patent No.: US 7,985,693 B2
(45) Date of Patent: Jul. 26, 2011

(54) METHOD OF PRODUCING PHASE CHANGE MEMORY DEVICE

(75) Inventors: Akiyoshi Seko, Tokyo (JP); Natsuki Sato, Tokyo (JP); Isamu Asano, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 49 days.

(21) Appl. No.: 12/289,002

(22) Filed: Oct. 17, 2008

(65) Prior Publication Data

US 2009/0104779 A1  Apr. 23, 2009

(30) Foreign Application Priority Data

Oct. 19, 2007  (JP) ................. 2007-272712

(51) Int. Cl.
*H01L 21/302* (2006.01)
(52) U.S. Cl. ........ 438/734; 438/102; 438/128; 438/584; 257/E21.017; 257/E21.075; 257/E21.645
(58) Field of Classification Search .................... 438/23, 438/42, 171, 190, 733, 329, 749; 257/E21.017, 257/E21.02, E21.045, E21.061, E21.075, 257/E21.485, E21.486, E21.613
See application file for complete search history.

(56) References Cited

U.S. PATENT DOCUMENTS

| 5,393,688 | A   | * | 2/1995  | Motonami et al. ............ 438/396 |
|-----------|-----|---|---------|--------------------------------------|
| 7,368,802 | B2  |   | 5/2008  | Hayakawa                             |
| 2002/0132417 | A1 | * | 9/2002 | Li ................................. 438/237 |
| 2003/0193063 | A1 |   | 10/2003 | Chiang et al.                       |
| 2006/0157683 | A1 | * | 7/2006 | Scheuerlein ....................... 257/4 |
| 2006/0284237 | A1 |   | 12/2006 | Park et al.                         |
| 2007/0063180 | A1 |   | 3/2007 | Asano et al.                        |
| 2009/0184310 | A1 | * | 7/2009 | Lung .............................. 257/4 |

FOREIGN PATENT DOCUMENTS

| JP | 2007-005785 A | 1/2007 |
| JP | 2007-073779 A | 3/2007 |
| JP | 2007-149899 A | 6/2007 |
| JP | 2007-180474 A | 7/2007 |

OTHER PUBLICATIONS

F. Bedeschi et al., "4-Mb MOSFET-Selected µTrench Phase-Change Memory Experimental Chip," IEEE Journal of Solid-State Circuits, vol. 40:7, Jul. 2005, 1557-1565.

* cited by examiner

*Primary Examiner* — Cheung Lee
(74) *Attorney, Agent, or Firm* — Foley & Lardner LLP

(57) ABSTRACT

An area where a lower electrode is in contact with a variable resistance material needs to be reduced to lower the power consumption of a variable resistance memory device. The present invention is to provide a method of producing a variable resistance memory element whereby the lower electrode can be formed smaller. Combining an anisotropic etching process with an isotropic etching process enables the lower electrode to be formed smaller.

18 Claims, 11 Drawing Sheets

(a) VERTICAL CROSS SECTION (Y-Z PLANE)

Fig. 3
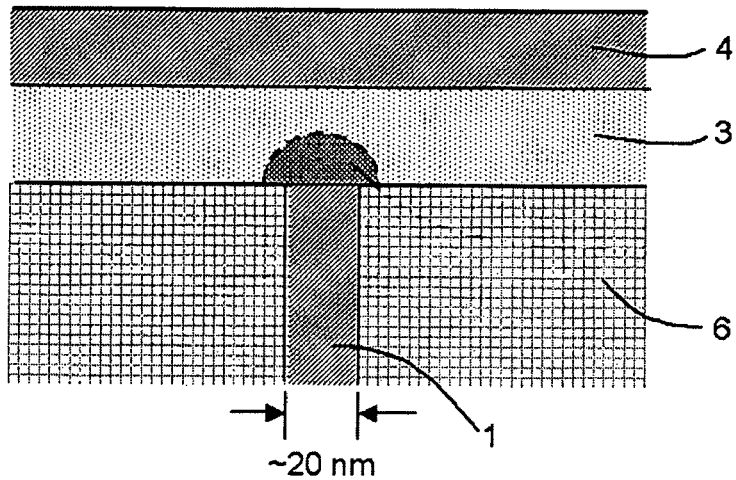
Fig. 4
(a) HORIZONTAL CROSS SECTION (X-Y PLANE)
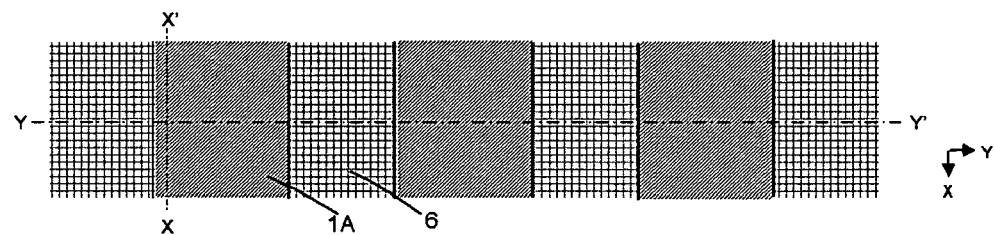
(b) VERTICAL CROSS SECTION (Y-Z PLANE)
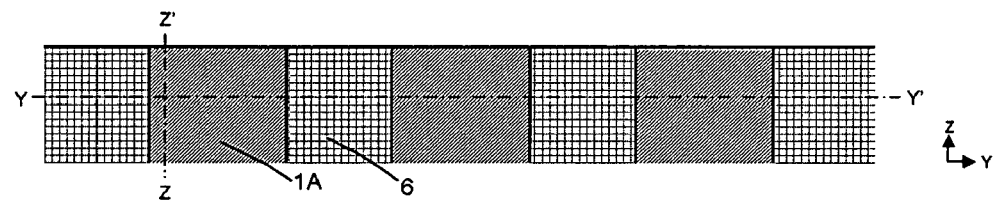
(c) VERTICAL CROSS SECTION (X-Z PLANE)
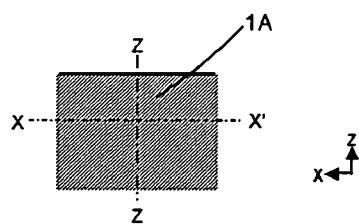

Fig. 5(a) HORIZONTAL CROSS SECTION (X-Y PLANE)
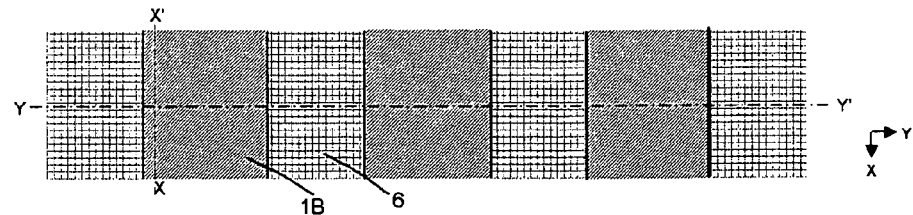
Fig. 5(b) VERTICAL CROSS SECTION (Y-Z PLANE)
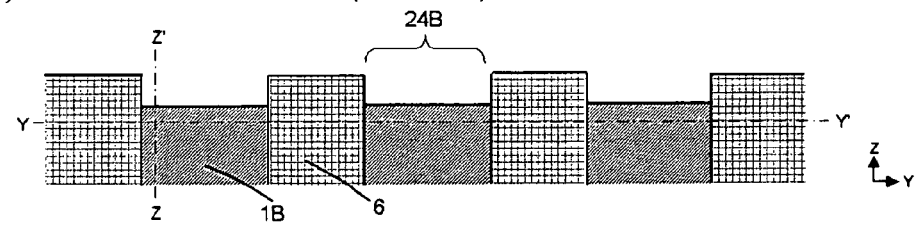
Fig. 5(c) VERTICAL CROSS SECTION (X-Z PLANE)
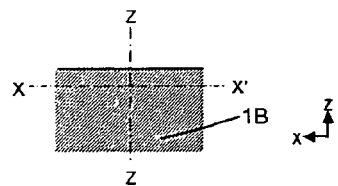
Fig. 6(a) HORIZONTAL CROSS SECTION (X-Y PLANE)
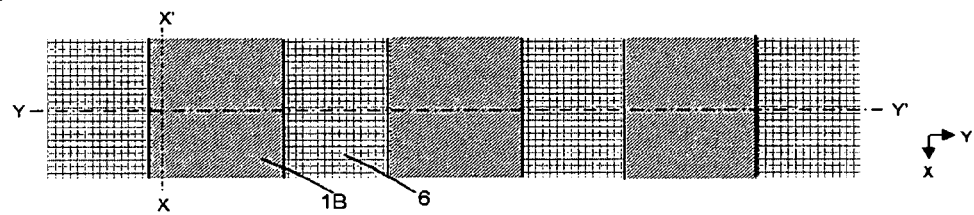
Fig. 6(b) VERTICAL CROSS SECTION (Y-Z PLANE)
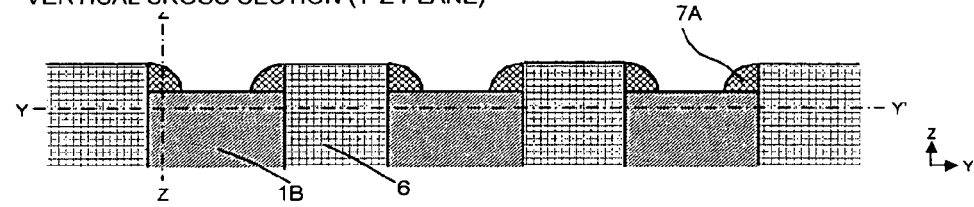
Fig. 6(c) VERTICAL CROSS SECTION (X-Z PLANE)
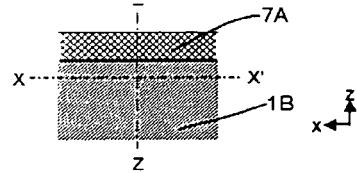

Fig. 7
(a) HORIZONTAL CROSS SECTION (X-Y PLANE)
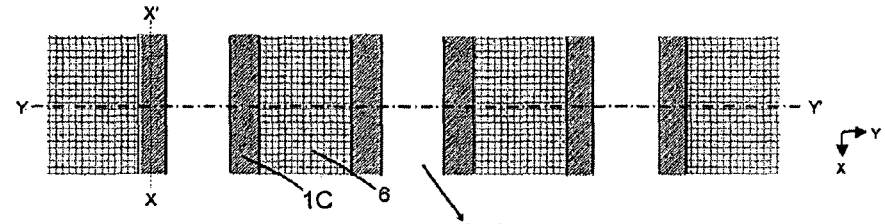
(b) VERTICAL CROSS SECTION (Y-Z PLANE)
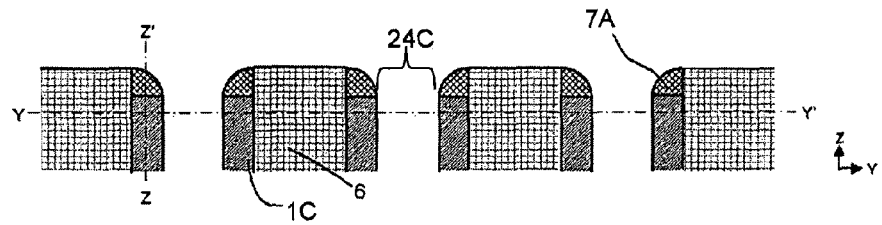
(c) VERTICAL CROSS SECTION (X-Z PLANE)
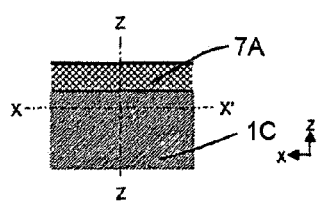
Fig. 8
(a) HORIZONTAL CROSS SECTION (X-Y PLANE)
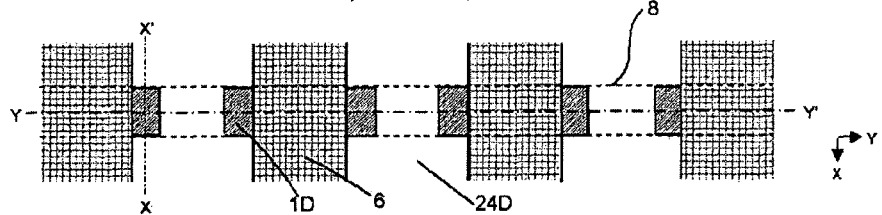
(b) VERTICAL CROSS SECTION (Y-Z PLANE)
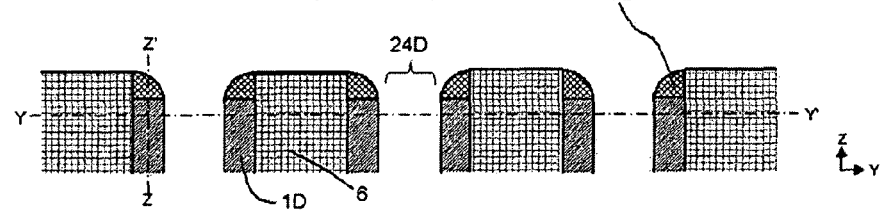
(c) VERTICAL CROSS SECTION (X-Z PLANE)
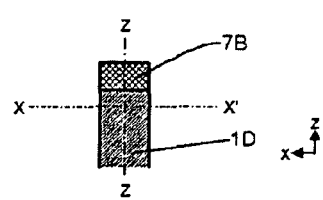

Fig. 9(a) HORIZONTAL CROSS SECTION (X-Y PLANE)
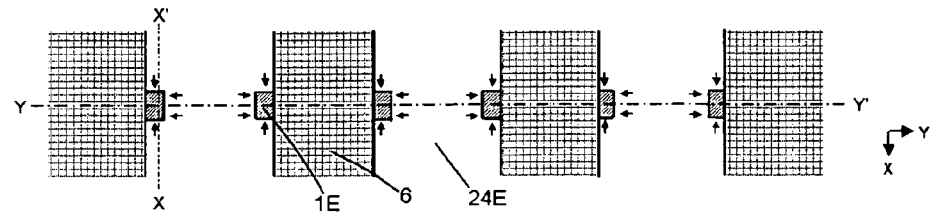
Fig. 9(b) VERTICAL CROSS SECTION (Y-Z PLANE)
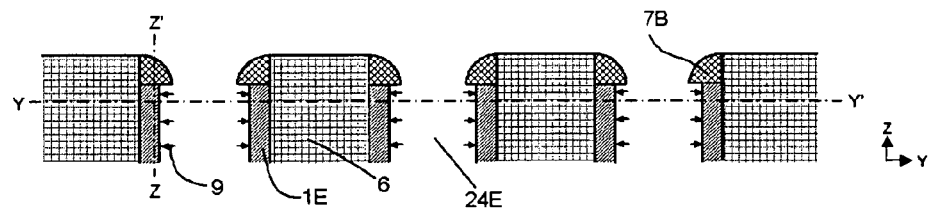
Fig. 9(c) VERTICAL CROSS SECTION (X-Z PLANE)
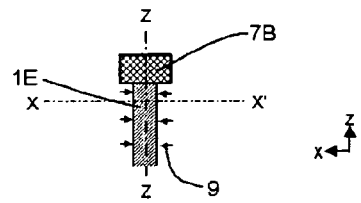
Fig. 10(a) HORIZONTAL CROSS SECTION (X-Y PLANE)
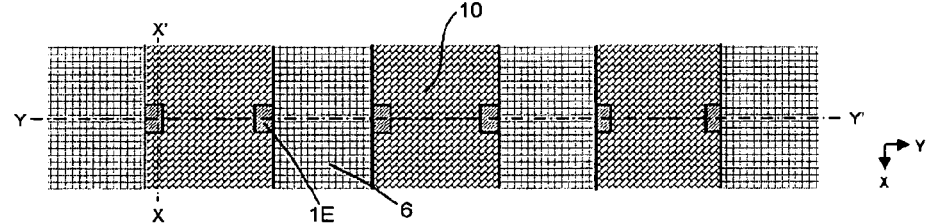
Fig. 10(b) VERTICAL CROSS SECTION (Y-Z PLANE)
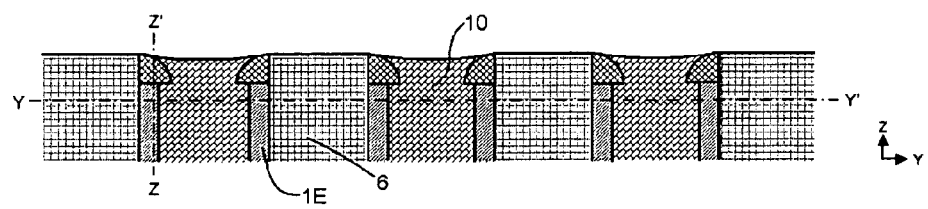
Fig. 10(c) VERTICAL CROSS SECTION (X-Z PLANE)
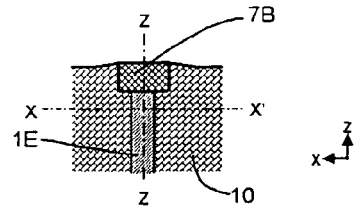

Fig. 11(a) HORIZONTAL CROSS SECTION (X-Y PLANE)
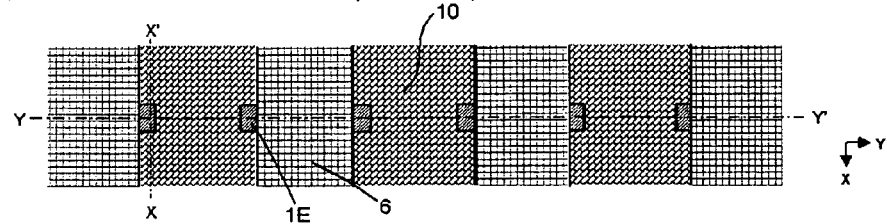
Fig. 11(b) VERTICAL CROSS SECTION (Y-Z PLANE)
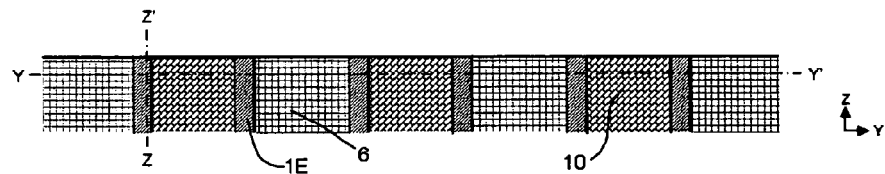
Fig. 11(c) VERTICAL CROSS SECTION (X-Z PLANE)
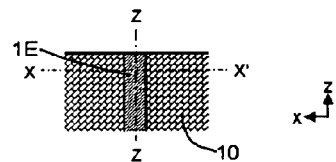
Fig. 12
VERTICAL CROSS SECTION (Y-Z PLANE)
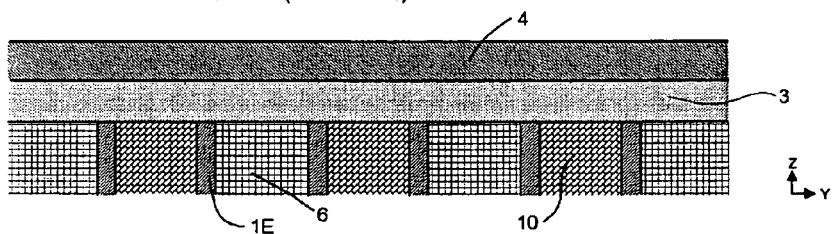
Fig. 13
VERTICAL CROSS SECTION (Y-Z PLANE)
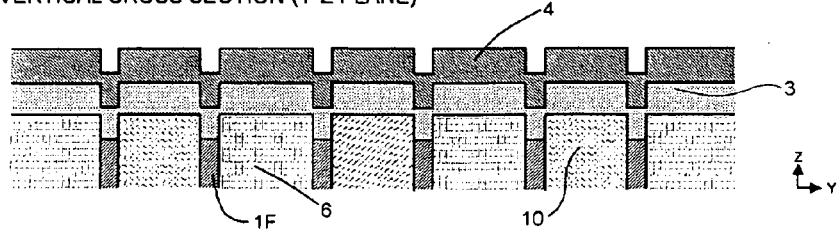

Fig. 14
VERTICAL CROSS SECTION (Y-Z PLANE)
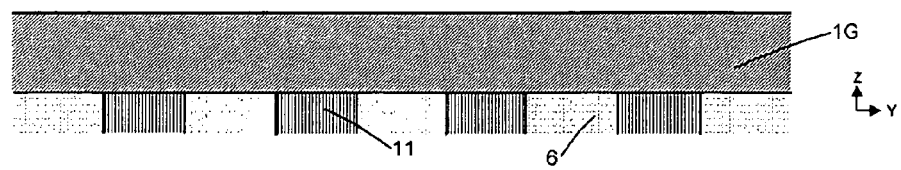
Fig. 15
VERTICAL CROSS SECTION (Y-Z PLANE)
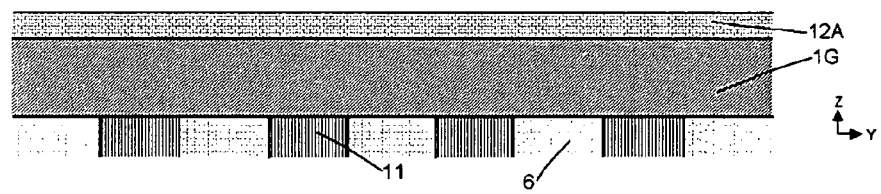
Fig. 16(a)   HORIZONTAL CROSS SECTION (X-Y PLANE)
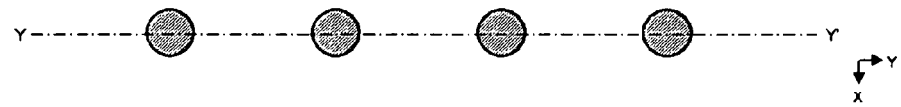
Fig. 16(b)   VERTICAL CROSS SECTION (Y-Z PLANE)
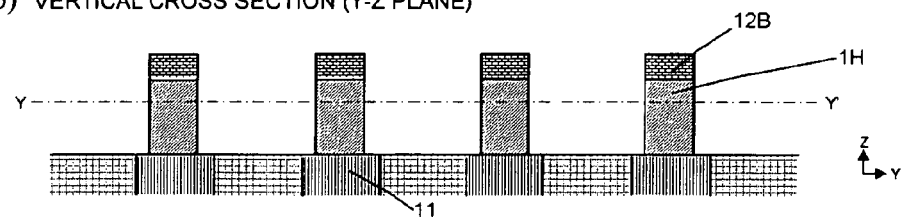

Fig. 17(a) HORIZONTAL CROSS SECTION (X-Y PLANE)
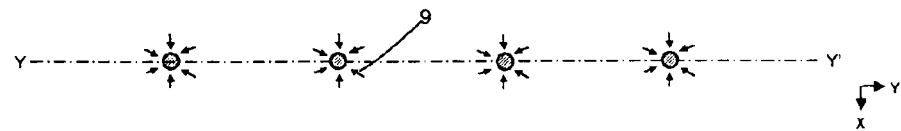
Fig. 17(b) VERTICAL CROSS SECTION (Y-Z PLANE)
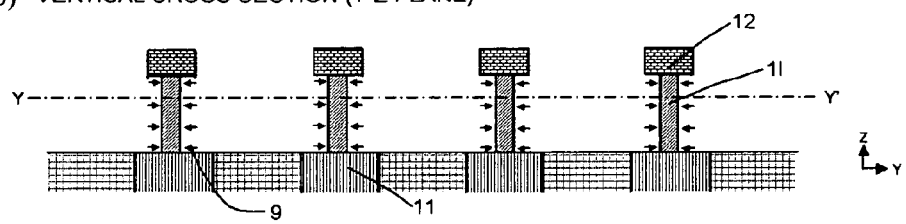
Fig. 18(a) HORIZONTAL CROSS SECTION (X-Y PLANE)
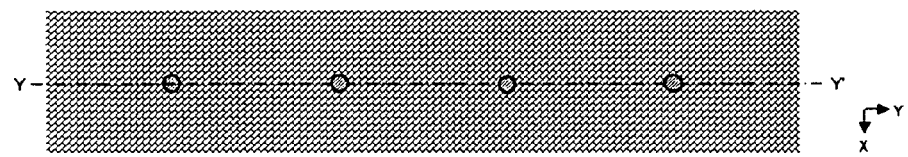
Fig. 18(b) VERTICAL CROSS SECTION (Y-Z PLANE)
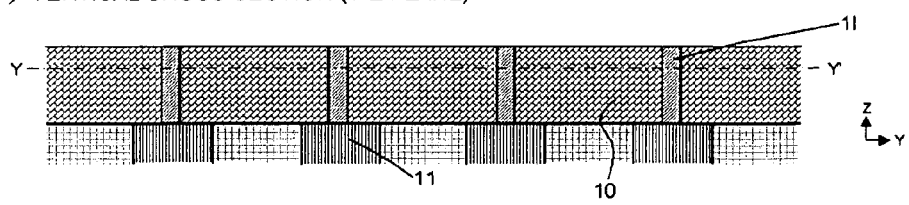

(a) VERTICAL CROSS SECTION (Y-Z PLANE)

METHOD OF PRODUCING PHASE CHANGE MEMORY DEVICE

BACKGROUND OF THE INVENTION

1. Field of the Invention

The present invention relates to an electrically rewritable non-volatile memory device and a method of producing the same.

2. Description of the Related Art

In the recent highly-sophisticated information society, there has been a demand for further improvement in performance of a solid-state memory device formed by using semiconductor integrated circuit technology. In particular, as the computational capacity of a micro processing unit (MPU) is improved, memory capacities of a computer and an electronic apparatus have been increased. Unlike a magnetic and a magneto-optical storage device such as a hard disk and a laser disk, the solid-state memory device does not have a physically driven portion therein. The solid-state memory device, therefore, has a high mechanical strength and can be highly integrated based on the semiconductor manufacturing technology. For this reason, the solid-state memory device has been used not only as a temporary storage device (cache) and as a main storage device (main memory) for a computer and a server, but also as an external storage device (storage memory) for a large number of mobile apparatus and household electrical appliances and has led to the development of a market on the order of several tens of billions of dollars at present.

Such solid-state memory devices are classified into three types according to their principle of operation: a static random access memory (SRAM), a dynamic random access memory (DRAM) and an electrically erasable and programmable read only memory (EEPROM) which is represented by a flash memory device. The SRAM is the fastest among the above memory devices; however, it cannot hold information while power is turned off, and requires a large number of transistors to store one bit, which is not suitable for providing a large capacity. For this reason, the SRAM is mainly used as cache in an MPU. The DRAM requires a refresh operation and operates slower than the SRAM; however, it can easily be integrated at a lower unit cost for one bit. Therefore, the DRAM is mainly used for a main memory of a computer and a household electrical appliance. On the other hand, the EEPROM is a non-volatile memory device capable of holding information even while the power supply is turned off. The EEPROM is slower in writing and erasing information than the above devices and requires relatively large electric power, and therefore, it is mainly used for memory storage.

Because the market for mobile communication equipment has rapidly grown in recent years, there has been a demand for the development of DRAM-compatible solid-state memory devices which are faster and capable of operating at a lower power consumption, and there has been demand for even non-volatile solid-state memory devices having features of both DRAM and EEPROM. For such a next-generation solid-state memory device, an attempt has been made to develop a resistive random access memory (RRAM) using a variable resistor and a ferroelectric RAM (FeRAM) using a ferroelectric substance. In addition, one of the promising candidates for a non-volatile memory device which is faster and capable of operating at a lower power consumption is a phase change random access memory (PRAM) using a phase change material. The phase change random access memory writes information at a speed as high as about 50 ns and has the advantage that the memory can be easily integrated because of its simple configuration.

The phase change memory device is a non-volatile memory device having a structure in which a phase change material is sandwiched between two electrodes. The memory device is selectively operated by an active element connected in series in a circuit. The active element includes, for example, a metal-oxide-semiconductor (MOS) transistor, a junction diode, a bipolar transistor and a Schottky barrier diode. FIG. 21 is a schematic cross section of a general vertical phase change memory device. FIG. 22 is a schematic cross section of a vertical phase change memory cell in which a general select MOS transistor is arranged. The vertical phase change memory device has a structure in which two electrodes in contact with the phase change material are arranged perpendicularly (vertically) with respect to the material. FIG. 23 is a circuit configuration of one cell corresponding to FIG. 22. A memory cell array is formed by cells arranged in a lattice configuration and each cell is made up of the combination of the phase change memory device and an selective active element (or MOS transistor in case of FIG. 23). This structure is characterized such that the cell can be easily and highly integrated and the cell integration techniques for the DRAM can be used because the cell is similar in configuration to the DRAM. As the case may be, the configuration of memory cell peripheral circuits and the memory cell can be further devised to form a memory cell without an selective active element.

Storage and erasure of data in the phase change memory device are performed by using thermal energy to cause a transition between two or more solid phases, such as (poly) crystal state and amorphous state in a phase change material. The transition between the crystal state and the amorphous state is identified as a change in a resistance value from a circuit connection through the electrodes. To apply thermal energy to the phase change material, an electric pulse (voltage or current pulse) is applied between the electrodes to heat the phase change material itself using Joule heating. At this point, for example, an electric pulse of a large current is applied to a phase change material in a crystal state for a short time to heat the phase change material to a high temperature near its melting point and then quench it, thereby turning the phase change material into an amorphous state (this state is called "resetting state"). This operation is generally referred to as resetting operation. On the other hand, in the resetting state, an electric pulse of a current smaller than in the resetting operation is applied to the phase change material for a relatively long time to heat the phase change material to the temperature of crystallization, thereby turning the phase change material into a crystal state (this state is called "setting state"). This operation is referred to as setting operation in contrast with the resetting operation.

Since the phase change memory device is activated by the selective active element, information needs to be rewritten within the driving current capacity of the selective active element. However, in a phase change memory device produced in the currently latest lithography technology, it is difficult to keep a current value required for the resetting operation within the driving current capacity of the selective active element, while maintaining the cell integration level as much as the DRAM.

It is effective to reduce (scale) the phase change area of the phase change material for enabling a vertical phase change memory device to switch at low electric power (current). For example, it is desirable to fully cover a lower (or an upper) electrode with a phase-change (or changed) area or to cause all paths of current flowing into the phase change random material to always pass the phase change area, in order to identify the transition of states of the phase change material as change in a resistance value when the resetting operation is performed from the setting state. The phase change area refers to an area where a phase change actually occurs. The entire volume of the formed phase change material does not always need to be the phase change area.

In the phase change memory device illustrated in FIG. 20, the phase change area in the phase change material is formed in the vicinity of an interface between the phase change material and a lower electrode where the highest current density appears at the time of writing information. In other words, heat is generated around the portion where the phase change material is in contact with the lower electrode and that portion mainly exhibits phase change. For this reason, reducing the contact cross section of the lower electrode in contact with the phase change material helps to reduce the phase change area and power consumption at the time of rewriting information. When self-joule heating occurs in the phase change material, the most of the heat will be dissipated in the electrode. From these standpoints, it is effective to reduce the contact cross section of the electrode in contact with the phase change material and the cross section of the electrode itself in terms of suppressing heat radiation from the phase change material and efficiently causing the phase change.

However, in the typical semiconductor manufacturing process, the dimension of the electrode connected to the phase change material is determined by the minimum processing dimension in a lithography processing, so it is difficult to reduce the dimension as small as the process trend or lower. The minimum processing dimension is the minimum formable processing linewidth dimension or the minimum formable processing space dimension which is determined by a manufacturing process, such as resolution capability in photolithography and processing capability in etching respectively and is in the order of 70 mm at present.

As described in Patent Document 1 and non-Patent Document 1, there has been presently proposed a technique in which a thin film electrode material is deposited on a trench structure (U shaped trench) and a protective insulating material and an insulating material are deposited thereon and planarization is performed, thereby forming a small electrode independently of lithography technique. FIGS. 24 and 25 are schematic diagrams illustrating a vertical cross section of an electrode in its forming step. As illustrated in FIG. 24, a lower electrode material and a protective insulating material are deposited on a trench structure and an insulating material is further deposited thereon by an SOG method. As illustrated in FIG. 25, planarization is performed using a CMP method, thereby forming a phase change memory device illustrated in FIG. 1. The method is capable of forming a lower electrode with a micro-cross section only using a relatively easy processing.

The necessity of forming such a small electrode is not limited to a phase change memory device. Patent Document 2 describes that the physical property change area of a variable resistor needs to be reduced in an RRAM.

The RRAM is a non-volatile memory element making use of the fact that a resistance change material exhibits resistance switching by applying a voltage pulse, and refers to all materials exhibiting the resistance switching based on a principle other than a resistance change caused by phase change such as the phase change memory element.

[Patent Document 1] US2003/0193063 A1
[Patent Document 2] Japanese Patent Laid-Open No. 2007-180474
[Non-Patent Document 1] F. Bedeschi et al. IEEE J. Solid-State Circuit 40 (2005)1557.

As described above, reduction in power consumption (particularly, current consumption) at the time of rewriting information in a phase change memory device is an essential issue to be resolved for an actual mass production. In general, it is known that the reduction of a contact area between the phase change material and the electrode reduces not only heat radiation from the electrode, but also power consumption (current) because the resistance switching can be achieved only in a small phase change area. However, in the manufacturing method of the vertical phase change memory device mainly based on conventional lithography processing techniques, the cross section of the electrode is determined by the minimum processing dimension in the lithography processing technique at the time of forming the electrode perpendicularly with respect to the phase change material (or with respect to a substrate), so that the improvement of performances of a semiconductor manufacturing apparatus is essential to reduce power consumption (current).

At present, as a method of solving the above issue, Patent Document 1 and non-Patent Document 1 have proposed a method in which an ultrathin electrode material is deposited on a trench structure. FIG. 1 is a schematic cross section of a vertical phase change memory device produced by the proposed method. The use of the trench structure allows a contact area to be reduced to approximately one fifth of an area in the related art. However, in the method, as illustrated in the three dimensional schematic diagram in the vicinity of the electrode in FIG. 2, while electrode width "d" in the X direction in the figure can be reduced to approximately 10 nm, electrode width "w" can be reduced only to the minimum processing dimension in the lithography processing because a lithography technique is used for processing in the Y direction in the figure.

SUMMARY OF THE INVENTION

The inventors dedicated themselves to solving the above issue and found a method of producing a lower electrode whose cross section dimension smaller than the minimum processing dimension in the lithography technology by performing isotropic etching following anisotropic etching.

A method of producing a semiconductor device, according to the present invention, having a variable resistance layer in contact with a lower electrode includes:

(1) forming a lower electrode material serving as the lower electrode;

(2) forming a mask on the lower electrode material;

(3) subjecting the lower electrode material to an anisotropic etching process using the mask to form a lower electrode precursor-form; and (4) subjecting the lower electrode precursor-form to an isotropic etching process using the mask to form the lower electrode.

According to the present invention, the size of the lower electrode can be formed smaller than the one fabricated by using only the lithography processing in semiconductor manufacturing techniques. Therefore, the size of a contact area between the lower electrode and a variable resistance material such as a phase change material can be further reduced than the one in the related art. This enables a reduction of power (current) consumption required at the time of rewriting information in variable resistance memory devices.

BRIEF DESCRIPTION OF THE DRAWINGS

FIG. 3 is a cross section of a phase change memory element having a small lower electrode;

FIG. 4 (consisting of FIGS. 4(a), 4(b) and 4(c)) is a partial cross section illustrating a state in which an insulating layer is patterned and then a lower electrode material is deposited and a planarization process is performed;

FIG. 5 (consisting of FIGS. 5(a), 5(b) and 5(c)) is a partial cross section illustrating a state in which the lower electrode material is selectively etched;

FIG. 6 (consisting of FIGS. 6(a), 6(b) and 6(c)) is a partial cross section illustrating a state in which a sidewall is formed on the lower electrode material;

FIG. 7 (consisting of FIGS. 7(a), 7(b) and 7(c)) is a partial cross section illustrating a state in which the lower electrode material is subjected to an anisotropic etching with the sidewall as a mask;

FIG. 8 (consisting of FIGS. 8(a), 8(b) and 8(c)) is a partial cross section illustrating a state in which the sidewall is shaped and then the lower electrode material is subjected to the anisotropic etching with the sidewall used as a mask;

FIG. 9 (consisting of FIGS. 9(a), 9(b) and 9(c)) is a partial cross section illustrating a state in which the lower electrode material is subjected to the isotropic etching with the sidewall used as a mask;

FIG. 10 (consisting of FIGS. 10(a), 10(b) and 10(c)) is a partial cross section illustrating a state in which an insulating material is deposited in a space created by the etching;

FIG. 11 (consisting of FIGS. 11(a), 11(b) and 11(c)) is a partial cross section illustrating a state in which the surface is planarized using the CMP method;

FIG. 12 is a cross section illustrating a state in which a phase change layer and an upper electrode layer are formed to produce the phase change memory element;

FIG. 13 is a cross section of the phase change memory element in which the lower electrode is formed and subjected to the selective etching and then the phase change layer and the upper electrode layer are formed;

FIG. 14 is a partial schematic cross section illustrating a state in which the lower electrode material is deposited on an underlying substrate;

FIG. 15 is a partial schematic cross section illustrating a state in which an insulating material is deposited;

FIG. 16 (consisting of FIGS. 16(a) and 16(b)) is a partial schematic cross section illustrating a state in which the lower electrode material and the insulating material are patterned by the lithography technique;

FIG. 17 (consisting of FIGS. 17(a), and 17(b)) is a partial schematic cross section illustrating a state in which the lower electrode material is subjected to the isotropic etching with the insulating material used as a mask;

FIG. 18 (consisting of FIGS. 18(a) and 18(b)) is a schematic cross section illustrating a state in which the insulating material is deposited in a space created by the etching, the insulating material is removed and planarization is performed;

DETAILED DESCRIPTION OF THE PREFERRED EMBODIMENTS

Figure 1:
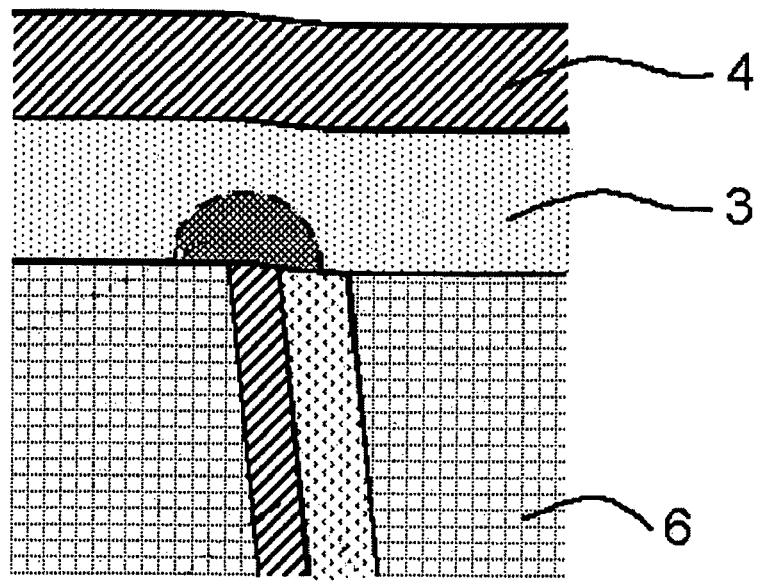
FIG. 1 is a schematic cross section of a phase change memory element in which an electrode is formed using a trench structure.
Figure 2:
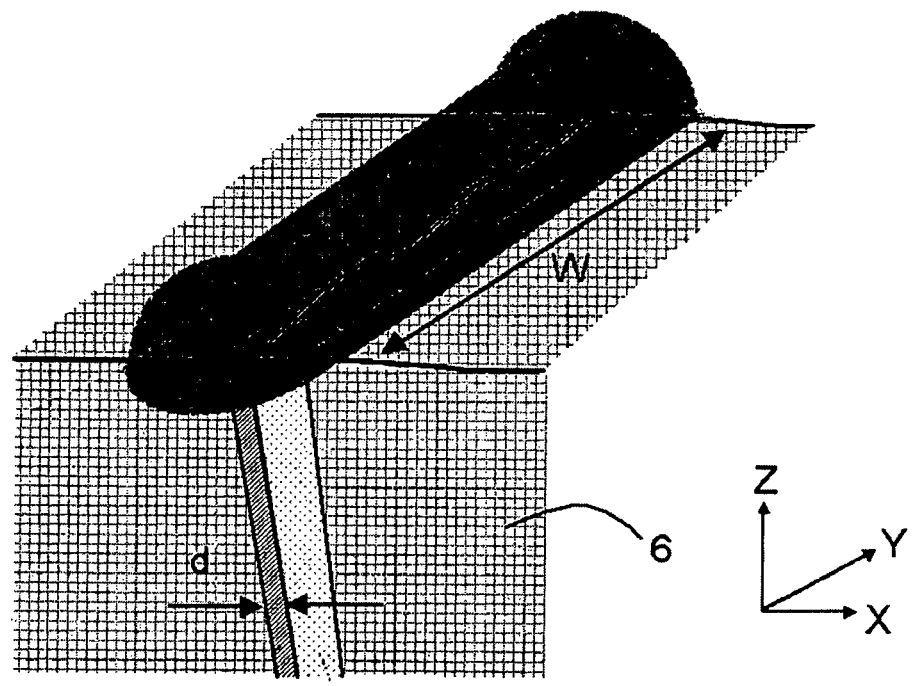
FIG. 2 is a three dimensional schematic diagram around an electrode of a vertical phase change memory element in which the electrode is formed using the trench structure.

In a lithography processing technique, a circuit pattern is developed by light or an electron beam on a substrate on which a photosensitive resin film is formed. With miniaturization of semiconductor devices in recent years, light used in the lithography has shifted to a short-wavelength light and has recently reached an extreme ultraviolet ray region which is the limit of short wavelength. With use of ArF excimer laser, the current minimum dimension which can be processed using light of a wavelength in the extreme ultraviolet ray region is at approximately 70 nm.

As described above, the size of a contact area of a lower electrode which contact with a variable resistance material (for example, a phase change material) needs to be reduced in order to lower the power consumption of a variable resistance memory device typified by the phase change memory device, and it is necessary that the lower electrode is formed smaller.

The inventors have dedicated themselves to solving the above issue and herein propose a method of forming the lower electrode smaller by combining anisotropic etching with isotropic etching.

In a method of producing a variable resistance memory element according to the present invention, a method of producing a semiconductor device with a variable resistance layer in contact with a lower electrode, includes the steps of:

(1) forming a lower electrode material serving as the lower electrode;

(2) forming a mask on the lower electrode material;

(3) subjecting the lower electrode material to an anisotropic etching process using the mask to form a lower electrode precursor-form; and (4) subjecting the lower electrode precursor-form to an isotropic etching process using the mask to form the lower electrode.

The present invention enables the dimension of the horizontal cross section of the lower electrode to be formed smaller than the minimum processing dimension in the lithography technique.

Before the variable resistance layer is formed after the lower electrode has been formed, only the lower electrode is selectively etched to remove a part thereof and then the variable resistance layer and the upper electrode can be formed. Forming a step between the lower electrode and an insulating layer therearound or the second insulating material enables confining an area where resistance varies in the variable resistance layer by the insulating layer or an insulation material. This improves heat efficiency to decrease power (current) consumption at the time of operation of the variable resistance memory device.

As material for the lower and the upper electrode material, any known electrode material may be used without any specific limitation. For example, materials which can be used include titanium (Ti), tantalum (Ta), molybdenum (Mo), niobium (Nb), zirconium (zr) or tungsten (W), or a nitride of these metals, or a silicide compound containing these metals and a nitride of these metals. Alternatively, an alloy containing the above metal may be used. Such compound as nitride and silicide forming the electrode material does not need to be in a stoichiometric ratio. In addition, impurities such as carbon (C) and the like may be added to the electrode material.

As material for the insulating layer, any known insulating material may be used without any specific limitation. For example, silicon oxide or silicon nitride may be used.

The first insulating material functions as a mask material at the time of subjecting the lower electrode material to an anisotropic etching process or the isotropic etching process. For example, silicon oxide or silicon nitride as the first insulating material may be used.

As a second insulating material, any known insulating material may be used without any specific limitation. For example, a material of the type that is same as the insulating layer may be used, and silicon oxide or silicon nitride may be used.

Materials for the variable resistance layer (hereinafter referred to as a "variable resistance material") may be any material whose electric resistance can be varied by voltage applied thereto and which is available as an information recording medium capable of storing and erasing data, and include, for example, resistance change materials such as titanium oxide ($TiO_2$), nickel oxide (NiO), copper oxide (CuO) and other transition metal oxides and a phase change material such as a chalcogenide material. In the present invention, the variable resistance material is not limited to the phase change material. The resistance change materials, instead of the phase change materials, can provide the advantage of an applying an smaller electrode. A small electrode that is formed to reduce power (current) consumption may reduce the physical property change area of the variable resistance material where resistance changes.

The phase change material may be any material which has two or more phase states and which has different electric resistances depending on the phase state. Although there is no particular limitation, it is preferable to use a chalcogenide material. A chalcogen element is made of a type of atoms that belongs to the VI group of the periodic table and refers to sulfur (S), selenium (Se) and tellurium (Te). In general, a chalcogenide material refers to a compound containing one or more chalcogen elements and any one of germanium (Ge), tin (Sn) and antimony (Sb) or a plurality of elements. In this case, a material with added elements such as nitrogen (N), oxygen (O), copper (Cu) and aluminum (Al) may be used. For example, the compounds include the elements of binary system such as GaS, InS, InSe, $Sb_2Te_3$ and GeTe, the elements of ternary system such as $Ge_2Sb_2Te_5$, InSbTe, GaSeTe, $SnSb_2Te_4$ and InSbGe and the elements of quaternary system such as AgInSbTe, (GeSn)SbTe, GeSb(SeTe) and $Te_{81}Ge_{15}Sb_2S_2$.

The material for the upper or the lower electrode, the insulating layer, the first insulating material and the variable resistance material may be deposited by any known depositing method without any specific limitation. For example, a physical vapor growth method using a spatter apparatus, a chemical vapor deposition (CVD) method, a sol-gel method or a spin coating method may be used.

Although the second insulating material may be deposited by a known depositing method, it is preferable to use a spin-on-glass (SOG) method.

Preferable embodiments are described below and a variable resistance memory element and a method of producing the same in the present invention are described in detail. The present invention is not limited to the following embodiments.

First Embodiment

Figure 21:
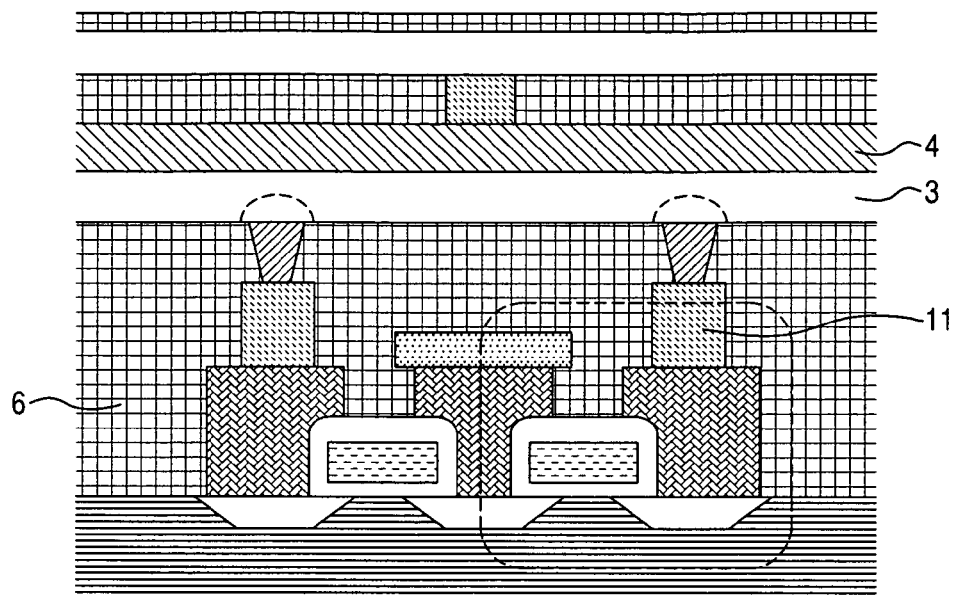
FIG. 21 is a schematic cross section of a vertical phase change memory device in which a general select MOS transistor is arranged.
Figure 22:
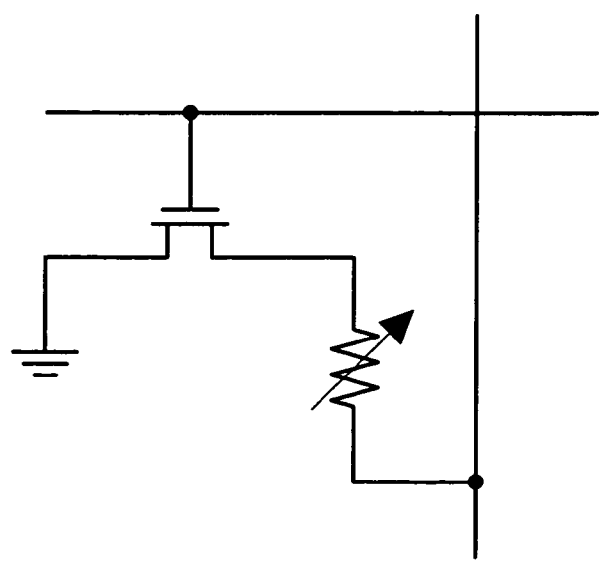
FIG. 22 is a circuit configuration of one cell corresponding to FIG. 21.
Figure 23:
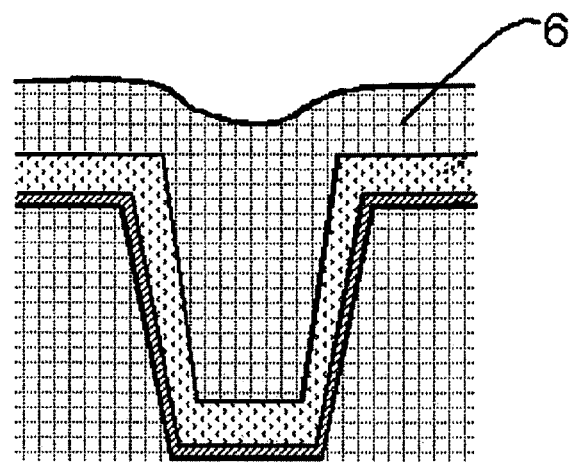
FIG. 23 is a partial cross section illustrating a state in which a lower electrode, a protective insulating film and an insulating film are deposited in a trench structure.
Figure 24:
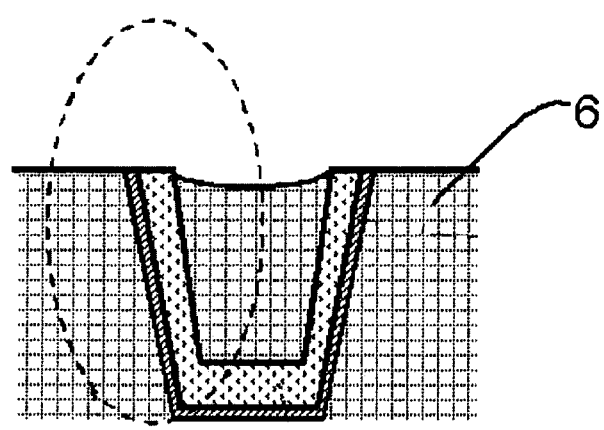
FIG. 24 is a partial cross section illustrating a state in which the surface is etched to expose the lower electrode.

FIG. 3 is a cross section of a phase change memory element with a small lower electrode 1. FIGS. 4 to 13 are views of partial cross sections of the production process for the phase change memory device in relation to an exemplary method of producing the variable resistance memory element according to the present invention. According to the present embodiment, a small lower electrode can be formed without collapsing during the steps of the formation process. The phase change memory element is incorporated into the vertical phase change memory device with a configuration illustrated in FIG. 21 to produce the phase change memory device (non-volatile memory device) according to the present invention.

In the present embodiment, although the phase change material is used as the variable change layer, the present invention is not limited to the phase change material.

The present embodiments perform the following steps of:

forming an insulting layer on a substrate on which an selective active element or a lower wire is formed and forming a first opening in which an electrode or a thorough hole connected to the lower wire or the selective active element is exposed in the insulting layer;

depositing a conductive material on the first opening and the insulating layer, and planarizing it to form a lower electrode material in the first opening;

forming a second opening by selectively etching a part of the lower electrode material on the flat surface formed of the lower electrode material and the insulating layer;

depositing a first insulating material on the main surface of the substrate including the second opening and subjecting the first insulating material to the anisotropic etching process to form a sidewall made up of the first insulating material on the side wall of the second opening;

subjecting the lower electrode material to the anisotropic etching process using the sidewall as a first mask to form a first lower electrode precursor-form;

forming a second mask by forming the sidewall smaller to be at least left on the electrode or the thorough hole connected to the lower wire or the selective active element, and forming a second lower electrode precursor-form by subjecting the first lower electrode precursor-form to the anisotropic etching process through the second mask;

subjecting the second lower electrode precursor-form to the isotropic etching process to form the lower electrode;

depositing a second insulating material around the lower electrode and performing a planarization process to expose the surface of the lower electrode; and forming a variable resistance layer and an upper electrode on the lower electrode.

(Description of Production Method)

The method of producing the phase change memory element according to the present embodiment is described with reference to FIGS. 4 to 13. The use of a self-alignment technique at the time of producing the phase change memory device can reduce variation in dimensions between the elements, suppressing variation in characteristics between the elements in a memory cell array.

FIG. 4 illustrates lower electrode material 1A and insulating layer 6. The phase change memory element is formed in the following method. For example, an insulating film, such as silicon dioxide ($SiO_2$), is deposited on an selective active element formed on, for example, a silicon substrate or on an underlying layer such as a silicon substrate and the like, and patterned to form a first opening (not shown). The first opening has a width, for example, of approximately 100 nm. If the cell has the selective active element, the patterning (to form the first opening) is performed to expose the electrode or the through-hole portion of the selective active element so that the phase change memory element can be connected to the selective active element by a lower electrode. The length of the first opening in the X direction is not particularly limited, and it may be formed in a trench shape or in a rectangular shape. Although the following description takes a part of one line in a memory cell array as an example, it is needless to say that a plurality of lines can be formed at the same time.

For example, a lower electrode material such as titanium nitride is deposited on the main surface of the substrate including the first opening. Thereafter, the substrate surface is planarized by a chemical mechanical polish (CMP) method or an etch back method to form a flat surface of lower electrode material 1A and insulating layer 6.

As illustrated in FIG. 5, lower electrode material 1A is subjected to selective etching to remove a part of lower electrode material 1A to form lower electrode material 1B and second opening 24B. In this case, a step between lower electrode material 1B and insulating layer 6 (or, a depth of second opening 24B) is desirably in the order of 40 nm, for example.

The first insulating material (for example, silicon nitride SiN) which is different from that of insulating layer 6 is deposited (not shown) to in the order of 40 nm to attain isotropic step coverage. Next, as illustrated in FIG. 6, the first insulating material is subjected to an anisotropic etching process to form sidewall 7A made up of the first insulating material on lower electrode material 1B and along second opening 24B.

As illustrated in FIG. 7, lower electrode material 1B is subjected to an anisotropic etching process with sidewall 7A as a first mask to be shaped into first lower electrode precursor-form 1C. The opening formed at this point is referred to as third opening 24C.

Sidewall 7A is shaped to sidewall 7B which is workable as a second mask by a lithography processing technique. As illustrated in FIG. 8, lower electrode material 1C is subjected to an anisotropic etching process with sidewall 7B as a mask to be shaped into second lower electrode precursor-form 1D. The opening formed at this point is referred to as fourth opening 24D.

As illustrated in FIG. 9, second lower electrode precursor-form 1D is subjected to an isotropic etching process with sidewall 7B as a mask to be formed smaller than the minimum processing dimension in lithography processing to form lower electrode 1E. The opening formed at this point is referred to as fifth opening 24E. Sidewall 7B is selectively removed and then second lower electrode precursor-form 1D may be subjected to an isotropic etching process. In that case, the upper portion of the lower electrode will also be etched at the time of the isotropic etching process, and therefore, the height of second lower electrode precursor-form 1D needs adjustment taking the etched amount into consideration. The isotropic etching process includes wet etching or reactive plasma etching, for example. At the time of the isotropic etching process, the sides of the lower electrode are also etched. Therefore, the lower electrode can be further reduced in size as compared with the case of so far proposed methods. Lower electrode 1E with a minute cross section formed by the present method is in contact with insulating layer 6. Therefore, the lower electrode hardly collapses. The lower electrode material is deposited one at a time in the area that has been processed smaller by the etching and that has no interface between similar or dissimilar materials. Therefore, the lower electrode hardly collapses. This prevents yield degradation.

The phase change memory element using lower electrode 1E with a minute cross section can be produced in the following procedure, for example.

As illustrated in FIG. 10, a material for insulating layer 10 (second insulating material) is deposited in fifth opening 24E that is made by the etching. In this case, the spin-on-glass (SOG) method may be used to uniformly deposit the material for insulating layer 10 to the bottom of sidewall 7B.

As illustrated in FIG. 11, planarization using the CMP method or the like can be used to expose the surface of lower electrode 1E.

As illustrated in FIG. 12, finally, phase change layer 3 as a variable resistance layer and upper electrode 4 are formed to produce the phase change memory element. As illustrated in FIG. 12, the upper electrode may be shared by a plurality of the phase change random access memories depending on an employed memory cell configuration.

Lower electrode 1E in FIG. 11 may be subjected to the selective etching process as illustrated in FIG. 13 to form a step between peripheral insulating layer 6 or insulating layer 10 and lower electrode 1F (the etched lower electrode), and thereafter, phase change layer 3 as a variable resistance layer and upper electrode 4 may be formed. The thus produced phase change memory element is improved in efficiency of heat generation because the phase change area thereof is covered with the insulating layer, and resistance switching due to phase change can be performed using low current. In this case, phase change layer 3 is preferably formed by using a CVD method. This is because, unlike the case where the phase change material is deposited using a spatter apparatus in which case a step (trench structure) cannot be deeply formed, the trench structure can be deeply formed because of the good coverage of the phase change material when the phase change material is deposited using the CVD method, and the efficiency of heat generation in the phase change area can be more effectively improved.

Second Embodiment

FIGS. 14 to 18 are views of partial cross sections of the phase change memory element in the production process in relation to a method of producing the phase change memory element according to the second embodiment. In the present embodiment, since a lower electrode is processed without forming an insulating layer having a supporting function, a mechanical strength may be inferior. However, the production method in the present embodiment is effective in that it can more easily form a smaller lower electrode than that in the first embodiment. Furthermore, the degree of freedom of cell array configuration is improved.

In the present embodiment, although the phase change material is used in the variable change layer, the present invention is not limited to the phase change material.

In the present embodiments, the following steps are performed:

depositing a conductive lower electrode material on a substrate on which an selective active element or a lower wire is formed;

depositing a first insulating material on the lower electrode material;

patterning the first insulating material and subjecting the lower electrode material to the anisotropic etching process using the patterned first insulating material as a mask to form a first lower electrode precursor-form;

subjecting the first lower electrode precursor-form to the isotropic etching process to form the lower electrode;

depositing a second insulating material around the lower electrode and performing a planarization process to expose the surface of the lower electrode; and forming a variable resistance layer and an upper electrode on the lower electrode.

(Description of Production Method)

As illustrated in FIG. 14, lower electrode material 1G is deposited on an selective active element formed on a silicon substrate or on an underlying substrate such as a silicon substrate. Lower electrode material 1G is formed to electrically connect to a lower wire or through hole 11. It is desirable to avoid formation of an extremely large film thickness in order to prevent the structure from collapsing during the subsequent etching process.

As illustrated in FIG. 15, first insulating material 12A such as silicon nitride is deposited on lower electrode material 1G. As described later, first insulating material 12A serves as a mask during an isotropic etching process in the subsequent steps. The mask may be removed before the isotropic etching. In that case, the upper portion of the lower electrode will also be etched at the time that the isotropic etching process is performed, and therefore, the thickness of lower electrode material 1G should be determined in consideration of the etched amount.

As illustrated in FIG. 16, first insulating material 12A is subjected to the anisotropic etching to be pattered and shaped into hard mask 12B. Lower electrode material 1G is subjected to the anisotropic etching with hard mask 12B as a mask to be shaped into first lower electrode precursor-form 1H. At this point, although the patterned shape viewed from the top of the substrate is desirably a circle for its good symmetry as illustrated in FIG. 16(a), a polygon or an ellipse may be used.

As illustrated in FIG. 17, the isotropic etching process, in etching direction 9 such as dry etching using reactant gas or wet etching is used to form first lower electrode precursor-form 1H smaller than the minimum processing dimension in the lithography processing to form lower electrode 1I. After that, a second insulating material (as an insulating layer 10) such as silicon oxide, for example, is deposited in a space created by etching using the SOG method and the like, for example.

As illustrated in FIG. 18, hard mask 12B is removed by planarization using the CMP method to expose the surface of lower electrode 1I.

Figure 19:
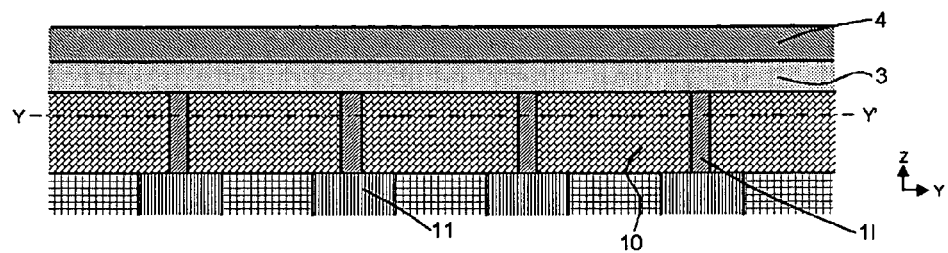
FIG. 19 is a schematic cross section illustrating of the phase change memory element having a small electrode formed by depositing the phase change layer and the upper electrode.
Figure 20:
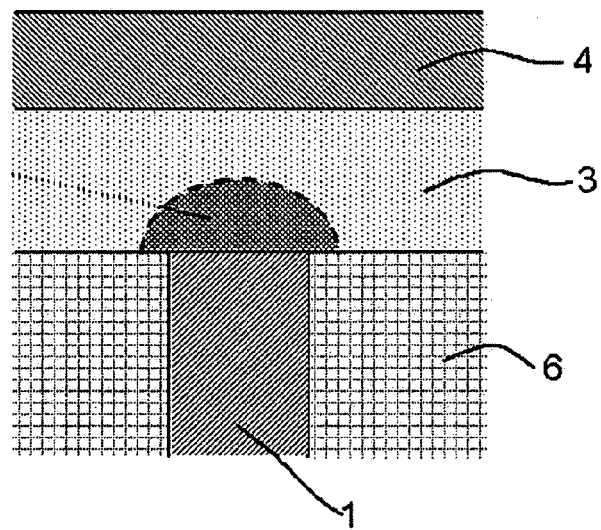
FIG. 20 is a schematic cross section of a general phase change memory element.

As illustrated in FIG. 19, phase change layer 3 as a variable resistance layer and upper electrode 4 are deposited to produce the phase change memory element having a small lower electrode.

As described above, according to the present invention, the lower electrode can be formed smaller than the minimum processing dimension in the lithography technique. In the variable resistance memory element produced by using the production method according to the present invention, it is expected that a current value required for rewriting information can be reduced by half or less than half as compared with the one required when the trench structure is used.

What is claimed is:

1. A method of producing a semiconductor device with a variable resistance layer in contact with a lower electrode, comprising:
    (1) forming a lower electrode material serving as the lower electrode;
    (2) forming a mask on the lower electrode material;
    (3) subjecting the lower electrode material to an anisotropic etching process using the mask to form a lower electrode precursor-form; and
    (4) subjecting the lower electrode precursor-form to an isotropic etching process using the mask to form the lower electrode,
    wherein
    in said forming a lower electrode material, a first opening is formed in an insulating layer formed on a substrate in which a selective active element or a lower wire is formed so that a through hole connected to the lower wire or to the selective active element is exposed and the lower electrode material is fowled in the first opening,
    in said forming a mask, a part of the lower electrode material is selectively etched on the flat surface made up of the lower electrode material and the insulating layer to form a second opening and a first insulating material is deposited on the main surface of the substrate including the second opening and subjected to the anisotropic etching process to form a sidewall made up of the first insulating material as the mask on a sidewall of the second opening,
    in said subjecting the lower electrode material to an anisotropic etching process, the lower electrode material is subjected to the anisotropic etching process using the sidewall as the mask to form the lower electrode precursor-form, and
    in said subjecting the lower electrode precursor-form to an isotropic etching process, the lower electrode precursor-form is subjected to the isotropic etching process using the sidewall as the mask to form the lower electrode.

2. The method of producing the semiconductor device according to claim 1, wherein
    in said forming a mask, the mask is formed by shaping a mask material formed on the lower electrode material into the form of a predetermined pattern.

3. The method of producing the semiconductor device according to claim 1, wherein
    in said subjecting the lower electrode precursor-form to an isotropic etching process, the mask is formed smaller, a second anisotropic etching process is performed using the mask formed smaller and then the isotropic etching process is performed, thereby forming the lower electrode.

4. The method of producing the semiconductor device according to claim 1, wherein
    in said subjecting the lower electrode material to an anisotropic etching process, the lower electrode material is subjected to the anisotropic etching process using the sidewall as the first mask to form a first lower electrode precursor-form, and
    in said subjecting the lower electrode precursor-form to an isotropic etching process, the sidewall is formed smaller to form a second mask, the first lower electrode precursor-form is subjected to the anisotropic etching process using the second mask to form a second lower electrode precursor-form and the second lower electrode precursor-form is subjected to the isotropic etching process to form the lower electrode.

5. The method of producing the semiconductor device according to claim 4, further comprising:
    (5) depositing a second insulating material around the lower electrode and performing a planarization process to expose the surface of the lower electrode; and
    (6) forming a variable resistance layer and an upper electrode over the lower electrode.

6. The method of producing the semiconductor device according to claim 4, wherein
    the second lower electrode precursor-form is subjected to the isotropic etching process while the second mask is present.

7. The method of producing the semiconductor device according to claim 1, further comprising:

(5) depositing a second insulating material around the lower electrode and performing a planarization process to expose the surface of the lower electrode; and (6) forming a variable resistance layer and an upper electrode on the lower electrode.

8. The method of producing the semiconductor device according to claim 7, wherein
before the variable resistance layer is formed after the lower electrode has been formed, a part of the lower electrode is selectively etched to be removed.

9. The method of producing the semiconductor device according to claim 7, wherein
the second insulating material is deposited around the lower electrode using a spin-on-glass (SOG) method.

10. The method of producing the semiconductor device according to claim 1, wherein
the variable-resistance layer uses a phase change material.

11. The method of producing the semiconductor device according to claim 10, wherein
the phase change material is chalcogenide.

12. A method of producing a semiconductor device with a variable resistance layer in contact with a lower electrode, comprising:
(1) forming a lower electrode material serving as the lower electrode;
(2) forming a mask on the lower electrode material;
(3) subjecting the lower electrode material to an anisotropic etching process using the mask to form a lower electrode precursor-form;
(4) subjecting the lower electrode precursor-form to an isotropic etching process using the mask to form the lower electrode;
(5) depositing a second insulating material around the lower electrode and performing a planarization process to expose the surface of the lower electrode; and
(6) forming the variable resistance layer and an upper electrode over the lower electrode, wherein
in said forming a lower electrode material, the lower electrode material is formed on a substrate in which a selective active element or a lower wire is formed,
in said forming a mask, a first insulating material is formed on the lower electrode material and patterned to form the mask,
in said subjecting the lower electrode material to an anisotropic etching process, the electrode material is subjected to an anisotropic etching process using the mask to form a lower electrode precursor-form, and
in said subjecting the lower electrode precursor-form to an isotropic etching process, the lower electrode precursor-form is subjected to an isotropic etching process using the mask to form the lower electrode.

13. The method of producing the semiconductor device according to claim 12, wherein the lower electrode precursor-form is subjected to the isotropic etching process while the mask made up of the first insulating material is present.

14. The method of producing the semiconductor device according to claim 12, wherein
the lower electrode precursor-form is subjected to the isotropic etching process while the mask made up of the first insulating material is present.

15. The method of producing the semiconductor device according to claim 12, wherein
before the variable resistance layer is formed after the lower electrode has been formed, a part of the lower electrode is selectively etched to be removed.

16. The method of producing the semiconductor device according to claim 12, wherein
the second insulating material is deposited around the lower electrode using a spin-on-glass (SOG) method.

17. A method comprising:
forming a conductive layer over a substrate, the conductive layer including an upper surface;
forming a mask over a part of the upper surface of the conductive layer;
selectively removing the conductive layer by using the mask to form a first electrode, the first electrode having a first top surface that is based in size on the mask;
performing a side etching on the first electrode to convert the first electrode into a second electrode, the second electrode having a second top surface that is smaller than the first top surface and a side surface extending downwardly from a periphery of the second top surface;
forming an insulating layer around the side surface of the second electrode while leaving at least a part of the second top surface of the second electrode exposed; and
forming an information storage layer in contact with the part of the second top surface of the second electrode,
wherein the forming the conductive layer comprises:
forming a first insulating film, the first insulating film having an upper surface;
forming a hole in the first insulating film; and
filling the hole with a conductive material up to a level that is lower than the upper surface of the first insulating film, the conductive layer, being thereby formed with a step between the upper surface of the conductive layer and the upper surface of the first insulating film; and
wherein the forming the mask comprises:
forming a second insulating film over the conductive layer and the first insulating film; and
etching back the second insulating film to form the mask covering the step between the upper surface of the conductive layer and the upper surface of the first insulating film.

18. The method as claimed in claim 17, wherein the forming the information storage layer includes forming a phase change layer with a size that is larger than the second top surface of the second electrode.

* * * * *